United States Patent
Wang

(10) Patent No.: US 9,628,080 B2
(45) Date of Patent: Apr. 18, 2017

(54) VOLTAGE GENERATING CIRCUITS BASED ON A POWER-ON CONTROL SIGNAL

(71) Applicant: Wen-Han Wang, Hsinchu (TW)

(72) Inventor: Wen-Han Wang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/759,718

(22) Filed: Feb. 5, 2013

(65) Prior Publication Data
US 2014/0002172 A1    Jan. 2, 2014

Related U.S. Application Data

(60) Provisional application No. 61/666,721, filed on Jun. 29, 2012.

(51) Int. Cl.
| | |
|---|---|
| *H03L 5/00* | (2006.01) |
| *H03L 7/00* | (2006.01) |
| *H03K 19/0185* | (2006.01) |
| *H03K 17/22* | (2006.01) |
| *H03K 17/687* | (2006.01) |
| *G06F 1/24* | (2006.01) |

(52) U.S. Cl.
CPC ... *H03K 19/018521* (2013.01); *H03K 17/223* (2013.01); *G06F 1/24* (2013.01); *H03K 17/6872* (2013.01)

(58) Field of Classification Search
CPC ...... H03K 17/22; H03K 17/223; H03K 3/356; H03K 19/018521; H03K 19/00315; H03K 17/102; H03K 3/012; G06F 1/24
USPC ......... 327/538–543, 365, 140–143, 306, 333
See application file for complete search history.

(56) References Cited

U.S. PATENT DOCUMENTS

| | | | |
|---|---|---|---|
| 5,378,943 A * | 1/1995 | Dennard | H03K 19/01852 326/121 |
| 6,573,768 B2 * | 6/2003 | Hwang | 327/143 |
| 6,750,676 B1 * | 6/2004 | Honda | 326/81 |
| 7,239,185 B2 * | 7/2007 | Koch et al. | 327/112 |
| 7,843,238 B2 * | 11/2010 | Ravatin et al. | 327/112 |
| 8,179,171 B1 * | 5/2012 | Zhang | 327/143 |

* cited by examiner

*Primary Examiner* — Dinh T Le
(74) *Attorney, Agent, or Firm* — Hauptman Ham, LLP

(57) ABSTRACT

A voltage generating circuit includes a first supply voltage node, a first switching device, a sub voltage generating circuit, and a second switching device. The first supply voltage node is configured to have a first supply voltage value, and is coupled with the first switching device. The sub voltage generating circuit is coupled in between the first switching device and the second switching device. The first switching circuit and the second switching circuit are configured to receive a control signal behaving based on the first supply voltage value and a second supply voltage value different from the first supply voltage value.

22 Claims, 9 Drawing Sheets

VOLTAGE GENERATING CIRCUITS BASED ON A POWER-ON CONTROL SIGNAL

CROSS-REFERENCE TO RELATED APPLICATION

The present application claims priority of U.S. Provisional Patent Application No. 61/666,721, filed on Jun. 29, 2012, which is incorporated herein by reference in its entirety.

FIELD

The present disclosure is related to a voltage generating circuit based on a power-on control (POC) signal.

BACKGROUND

Some integrated circuits include core transistors and input-output (IO) transistors. Core transistors are smaller, occupy less die space, and use a lower supply voltage and lower voltage level signals than IO transistors. In contrast, IO transistors are larger, occupy a larger die space, and use a higher supply voltage and higher voltage level signals.

In some approaches, an input-output (IO) control pin of an integrated circuit uses a voltage level shifter to shift a voltage level of signals for core transistors to a voltage level of signals for IO transistors. Each level shifter in turns uses a native transistor to operate at a low operational core voltage value, such as 1 V. A native transistor is a transistor having a 0 V threshold voltage value. The native transistor occupies about 30% of the total area of a control circuit of the level shifter. A mask used to manufacture the native transistor is expensive.

In some other approaches, a power-on control (POC) circuit is used as an attempt to avoid unknown states of IO pins during power up. The unknown state of the IO pins result in an IO crowbar current and/or a bus contention condition in some situations, such as when a core operational supply voltage is at an operational voltage before an IO operational supply voltage. The level shifter circuit also uses a native transistor, resulting in a larger die area and higher costs compared with a level shifter that does not use the native transistor.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
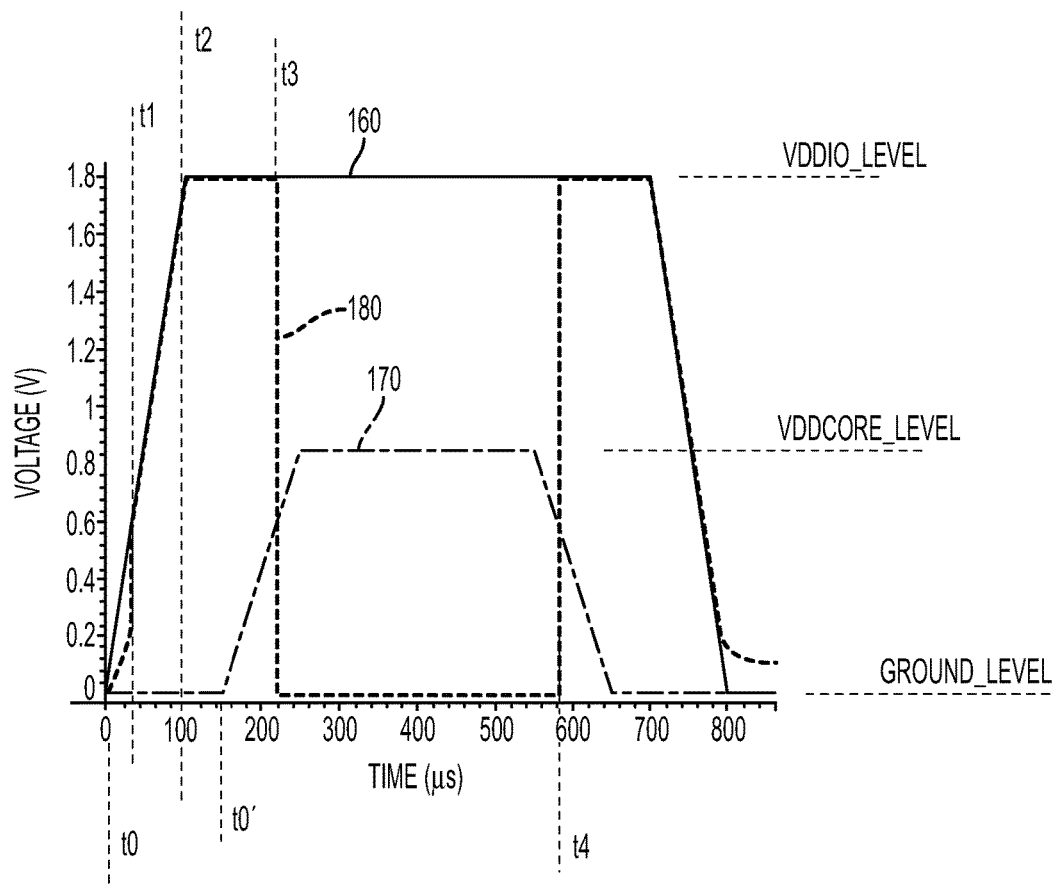
FIG. 1 is a graph of waveforms used to illustrate behaviors of a signal based on a power-on control (POC) condition, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and or advantages. A voltage generating circuit generates a control voltage based on a power-on control (POC) signal, which prevents a dead zone condition. In some embodiments, the voltage generating circuit is used in a voltage level shifting circuit ("a level shifter"). Compared with an existing approach, an area of the level shifter in accordance with various embodiments of the present disclosure is reduced by about 80%. Input-output (IO) speed is improved. No native transistors are used in the level shifter. Costs of masks to manufacture native transistors are avoided.

For simplicity, in this document, a reference name is used for both a node or a line and a corresponding signal or voltage thereon. For example, a reference VDDIO in FIG. 1 is used to refer to both a node VDDIO and a signal or a voltage on node VDDIO.

Behavior of a Signal Poc

FIG. 1 is a graph of waveforms used to illustrate a behavior of a signal POC based on a power-on control (POC) condition, in accordance with some embodiments. Signal POC is used in different circuits 200-700 in FIGS. 2-7. Circuits 200-700 include electrical devices functioning in two different supply voltage domains, including a "core" domain and an "input-output" (IO) domain, for example. For illustration, a predetermined supply voltage value for a core operational supply voltage in the core domain is called VDDCORE_LEVEL, and is about 0.85 V in some embodiments. In contrast, a predetermined supply voltage value for an IO operational supply voltage in the IO domain is called VDDIO_LEVEL, and is about 1.8 V, 2.5 V or 3.3 V in some embodiments. Other supply voltage values in both the core and the IO domains are within the scope of various embodiments. In some embodiments, a low voltage value of signals in both the core domain and the IO domain is at a ground reference level or 0 V. A high voltage value of signals in the core domain is at voltage VDDCORE_LEVEL while a high voltage value of signals in the IO domain is at voltage VDDIO_LEVEL.

In FIG. 1, for illustration, the X axis shows a time expansion of about 850 µS, while the Y axis shows a voltage expansion of about 1.8 V. Voltage VDDIO_LEVEL is about 1.8 V, and voltage VDDCORE_LEVEL is about 0.85 V. A waveform 160 represents a signal VDDIO (shown in FIG. 2), a waveform 170 represents a signal VDDCORE (not labeled), and a waveform 180 represents signal POC.

At a time t0, signal VDDIO represented by line 160 is powered on. Signal VDDIO starts to increase until a time t2 when signal VDDIO reaches the predetermined voltage VDDIO_LEVEL of about 1.8V. Signal VDDIO remains at voltage VDDIO_LEVEL until after time t4 when circuits 200-700 in FIGS. 2-7 are powered down.

Signal POC represented by line 180 also increases as signal VDDIO increases. From time t0 to a time t1, signal POC is substantially similar to signal VDDIO. From time t1 to time t3, signal POC follows signal VDDIO. In other words, signal POC is the same as signal VDDIO. As a result, line 160 and line 180 are the same from time t1 to time t3. Because between time t0 and time t1 signal POC is substantially similar to signal VDDIO, for simplicity of illustrations, signal POC and signal VDDIO are considered the same between time t0 and time t3.

At time t2, signal VDDIO represented by line 160 has reached an operational voltage VDDIO_LEVEL of 1.8 V, but signal VDDCORE represented by line 170 remains inactive at 0 V.

At time t0', signal VDDCORE represented by line 170 is activated. Voltage VDDCORE starts to increase until time t3 when voltage VDDCORE is considered sufficiently high to provide an operational voltage value for devices in the core domain. At time t3, when voltage VDDCORE reaches about 0.6 V, both voltages VDDIO and VDDCORE are logically high, and signal POC transitions to a low logical value. Other values at which voltage VDDCORE is considered logically high are within the scope of various embodiments. Soon after time t3, voltage VDDCORE reaches its predetermined operational voltage VDDCORE_LEVEL of about 0.85 V, and remains at voltage VDDCORE_LEVEL until a time before time t4 when circuits 200-700 in FIGS. 2-7 are powered down.

Between time t0 and time t3, signal POC and circuits 200-700 in FIGS. 2-7 are in a power-on mode. Between time t3 and time t4 when both voltages VDDIO and VDDCORE are logically high, signal POC and circuits 200-700 are in a normal operational mode. After time t4, signal POC and circuits 200-700 are in a power-down mode.

In brief, signal POC is logically high during a later part of the power-on condition, such as between time t2 and time t3. Signal POC is logically low when both voltages VDDIO and VDDCORE are logically high and signal POC is in the normal operational mode, such as between time t3 and time t4. Signal POC returns to a logically high value at time t4 when voltage VDDCORE represented by line 170 is considered logically low.

For illustration, voltage VDDIO is considered logically high at time t2 when voltage VDDIO reaches voltage VDDIO_LEVEL. Other values of voltage VDDIO to be considered logically high are within the scope of various embodiments. For example, voltage VDDIO is considered logically high when voltage VDDIO is about 80% of the predetermined voltage VDDIO_LEVEL.

Circuits to Generate Signal Pocint

Figure 2:
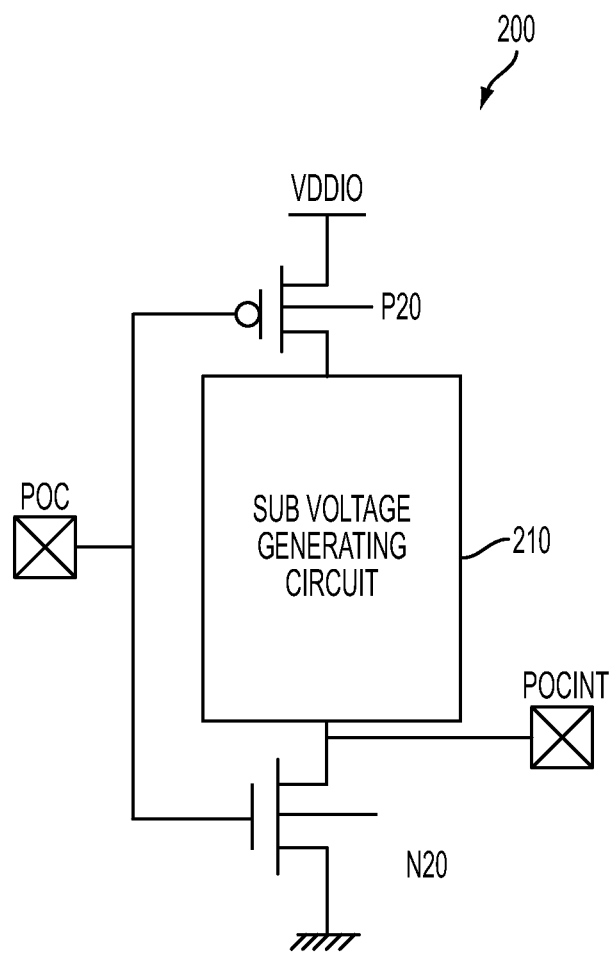
FIG. 2 is a diagram of a voltage generating circuit configured to generate a voltage based on the signal in FIG. 1, in accordance with some embodiments.

FIG. 2 is a diagram of a voltage generating circuit 200, in accordance with some embodiments. Circuit 200 is used to generate a voltage POCINT based on voltage VDDIO_LEVEL of signal VDDIO and signal POC. Voltage POCINT is used in a level shifter circuit 700 in FIG. 7 as an illustration.

A P-type metal oxide semiconductor (PMOS) transistor P20 functions as a current source while an N-type metal oxide semiconductor (NMOS) transistor N20 functions as a current sink for circuit 200.

Signal POC at gates of transistors P20 and N20 controls transistors P20 and N20. In some embodiments, in a normal operation of circuit 200, such as between time t3 and time t4 in FIG. 1, signal POC is logically low. As a result, NMOS transistor N20 is turned off while PMOS transistor P20 is turned on. A sub voltage generating circuit 210 is configured to provide voltage POCINT based on voltage VDDIO_LEVEL of signal VDDIO, a voltage VSDP20 (not labeled), and a voltage drop across sub voltage generating circuit 210. Voltage VSDP20 is a voltage drop across a source and a drain of PMOS transistor P20, which, in some embodiments, is 0 V.

During the power on mode when signal VDDIO and signal POC are the same, such as between time t0 and time t3 in FIG. 1, voltage POCINT is logically low. For example, at time t0, signal POC is logically low, NMOS transistor N20 is turned off, and PMOS transistor P20 is turned on. As a result, in some embodiments, voltage POCINT is logically low due to a low voltage value of voltage VDDIO at the source of PMOS transistor P20, regardless of a voltage drop across sub voltage generating circuit 210. When signal POC increases above a threshold voltage of NMOS transistor N20, NMOS transistor N20 is turned on. Voltage POCINT is therefore pulled to ground at a source of NMOS transistor N20. In other words, voltage POCINT is also logically low in such a situation.

PMOS transistor P20 and NMOS transistor N20 are used in circuit 200 for illustrations. Multiple transistors used in place of a single transistor are within the scope of various embodiments. For example, two or more PMOS transistors coupled in series are used in place of PMOS transistor P20, and two or more NMOS transistors coupled in series are used in place of NMOS transistor N20. Other switching devices including other types of transistors are also within the scope of various embodiments. For example, a P-doped N-doped and P-doped (PNP) bipolar junction transistor (BJT) is used in place of PMOS transistor P20 while an NPN BJT is used in place of NMOS transistor N20. A transmission gate that includes a P-type and an N-type transistor is used in place of PMOS transistor P20 or NMOS transistor N20, etc.

Various Embodiments of Sub Voltage Generating Circuit

Figure 3:
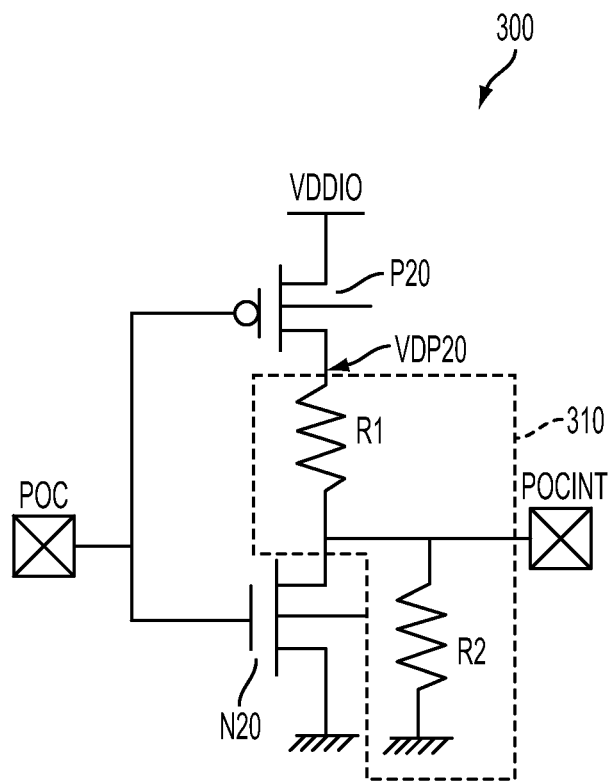
FIG. 3 is a diagram of a voltage generating circuit, in accordance with some embodiments.

FIG. 3 is a circuit diagram of a circuit 300, in accordance with some embodiments. Circuit 300 is circuit 200 in which sub voltage generating circuit 210 is implemented with a sub voltage generating circuit 310. For illustration, in circuit 300 and circuits 400, 500, and 600 in corresponding FIGS. 4, 5, and 6, signal POC is logically low to turn on PMOS transistor P20 and to turn off NMOS transistor N20. In other words, circuits 300-600 operate in the normal operational mode.

A voltage VDP20 at the drain of PMOS transistor P20 and one end of resistor R1 is voltage VDDIO minus voltage VSD20. Resistors R1 and R2 in circuit 310 function as a voltage divider. As a result, voltage POCINT is provided based on an equation (1)

$$POCINT = R2 * VDP20 / (R1 + R2)$$

Using equation (1) and based on voltage VDP20, different values of resistors R1 and R2 are selected to provide different values for voltage POCINT.

Figure 4:
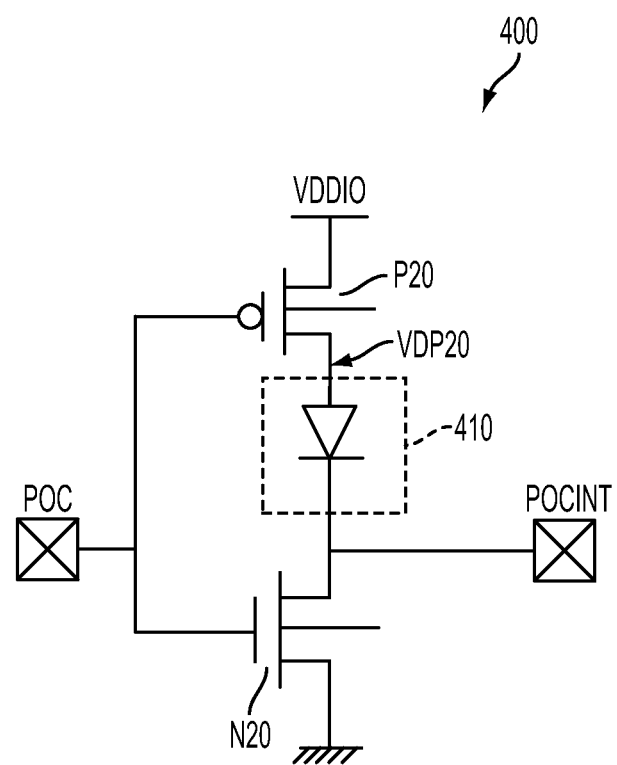
FIG. 4 is a diagram of a voltage generating circuit, in accordance with some embodiments.

FIG. 4 is a diagram of a circuit 400, in accordance with some embodiments. Circuit 400 is circuit 200 in which sub voltage generating circuit 210 is implemented with a diode 410. Voltage POCINT is equal to voltage VDP20 minus a voltage drop across diode 410, which varies depending on various factors, including, for example, a doping level, a process profile to manufacture diode 410, etc. In some embodiments, the voltage drop across diode 410 is about 0.3 V.

Figure 5:
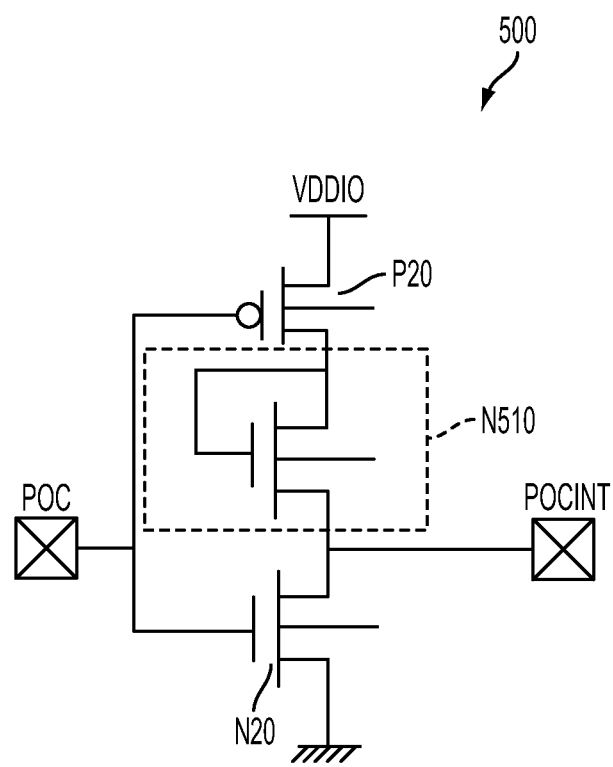
FIG. 5 is a diagram of a voltage generating circuit, in accordance with some embodiments.

FIG. 5 is a diagram of a circuit 500, in accordance with some embodiments. Circuit 500 is circuit 400 in which diode 410 is implemented with an NMOS transistor N510. A gate and a drain of NMOS transistor N510 are coupled together and to the drain of PMOS transistor P20. A source of NMOS transistor N510 is coupled with the drain of NMOS transistor N20, and serves to provide voltage POCINT.

Figure 6:
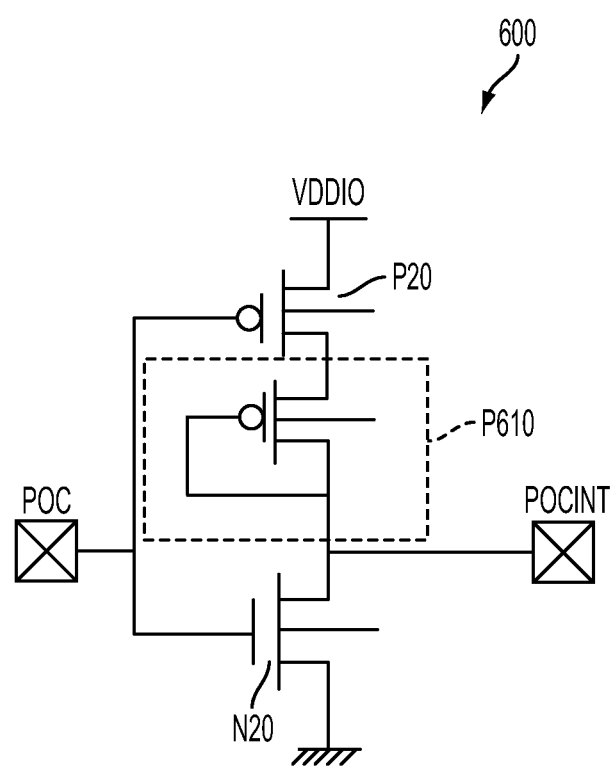
FIG. 6 is a diagram of a voltage generating circuit, in accordance with some embodiments.

FIG. 6 is a diagram of a circuit 600, in accordance with some embodiments. Circuit 600 is circuit 400 in which diode 410 is implemented with a PMOS transistor P610. A gate and a drain of PMOS transistor P610 are coupled together and to the drain of NMOS transistor N20, and serve to provide voltage POCINT. A source of PMOS transistor P610 is coupled with the drain of PMOS transistor P20.

In FIGS. 4, 5, and 6, one diode or a transistor configured as a diode is shown for illustration. A different number of diodes and/or transistors configured as diodes and coupled in series is within the scope of various embodiments. For example, if two diodes are used, voltage POCINT is equal to voltage VDP20 minus a voltage drop across two diodes, and if three diodes are used, voltage POCINT is equal to voltage VDP20 minus a voltage drop across three diodes, etc. In some embodiments, a voltage value of voltage POCINT is predetermined. A number of diodes and/or transistors configured as diodes is implemented to provide voltage POCINT based on voltage VDDIO. Additionally, other circuits used to generate voltage POCINT based on voltage VDD_LEVEL of signal VDDIO and voltage POC are within the scope of various embodiments.

For illustrations, transistors operating with supply voltage VDDCORE and core signals are called core transistors while transistors operating with supply voltage VDDIO and IO signals are called IO transistors. Transistors in FIGS. 2-6 are IO transistors.

Figure 7:
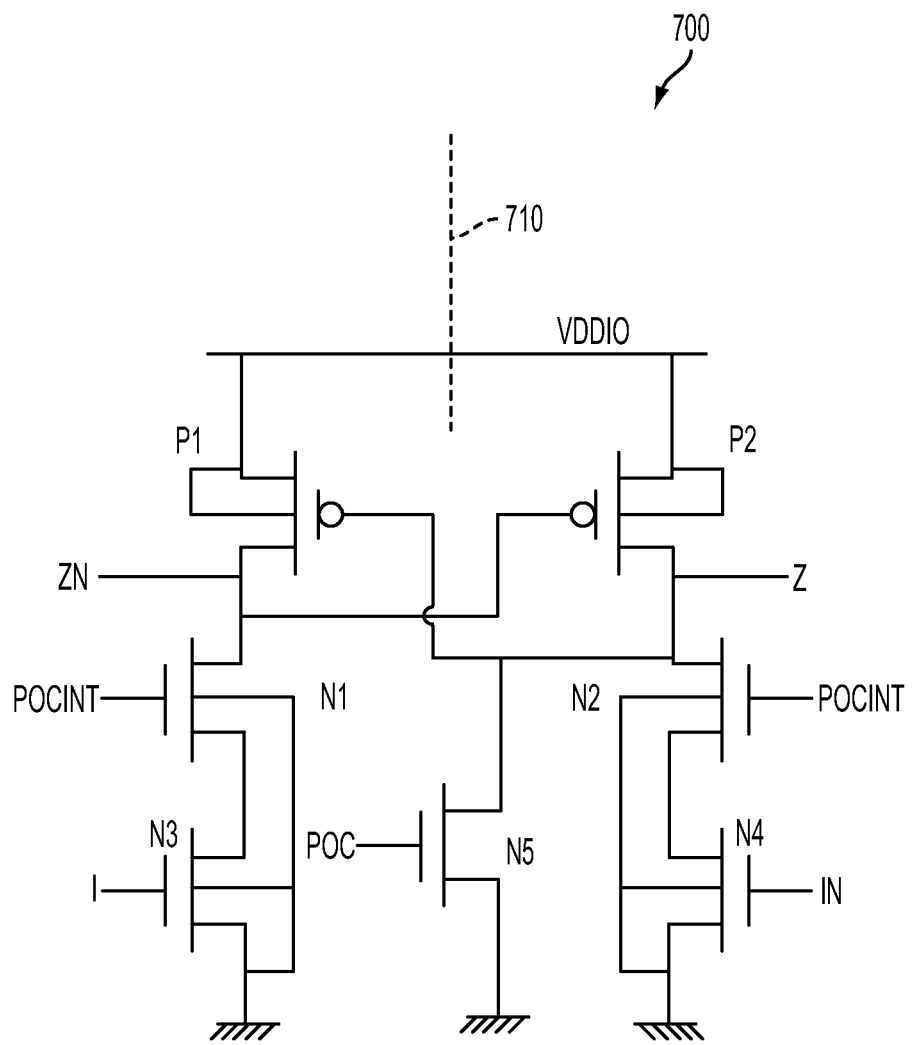
FIG. 7 is a diagram of a voltage level shifting circuit, in accordance with some embodiments.

An Application of Signal Pocint and Signal Poc in a Voltage Level Shifter Circuit FIG. 7 is a diagram of a voltage level shifter circuit (level shifter) 700, in accordance with some embodiments. Level shifter 700 is used to illustrate an application of voltage POCINT and voltage POC. Other circuits using voltages POCINT and POC are within the scope of various embodiments.

Level shifter 700 is symmetrical. For example, except for an NMOS transistor N5, circuit elements on the left of a reference line 710 are the same as circuit elements on the right of reference line 710. For another example, transistors P1, N1, and N3 function in a similar manner as transistors P2, N2, and N4, respectively. Operations on signals I and Z are functionally similar to operations on signals IN and ZN, respectively.

In some embodiments, transistors P1, P2, N1, N2, and N5 are IO transistors while transistors N3 and N4 are core transistors. Sources of PMOS transistors P1 and P2 are configured to receive IO supply voltage VDDIO, which, in some embodiments, is 1.8 V. Input signals I and IN are core signals that use voltage VDDCORE_LEVEL as a high voltage level. In contrast, signals POC, ZN, and Z are IO signals that use voltage VDDIO_LEVEL as a high voltage level.

Input signals I and IN are an inverse of one another. For example, when signal I is logically low, signal IN is logically high, and vice versa. Output signals Z and ZN are also an inverse of one another. Output signal Z corresponds to input signal I while output signal ZN corresponds to input signal IN. For example, when signal I is logically low, signal Z is also logically low and signals IN and ZN are logically high, and vice versa.

Circuit 700 functions as a voltage level shifter. The following examples are explained in the context of input signal I and output signal Z. Based on the symmetry of circuit 700, operations on input signal IN and output signal ZN are similar to operations on input signal I and output signal Z. Circuit 700 receives signal I having a core voltage level VDDCORE_LEVEL and provides signal Z having an IO voltage value VDDIO_LEVEL. Effectively, circuit 700 shifts a voltage VDDCORE_LEVEL of input I to voltage VDDIO_LEVEL of output Z.

Signal POCINT at gates of transistors N1 and N2 is used to control transistors N1 and N2. For illustration, signal POCINT at the gate of transistor N1 is logically high to turn on transistor N1, and signal I is also logically high. As a result, node ZN at a drain of transistor N1 is pulled to ground or a low logical value at a source of NMOS transistor N3. At the same time, signal IN at a gate of transistor N4 is logically low. As a result, transistor N4 is turned off, and transistors N2 and N4 function as an open circuit. Node ZN is also coupled with a gate of transistor P2, and is logically low. PMOS transistor P2 is therefore turned on. Because PMOS transistor P2 is turned on and NMOS transistors N2 and N4 function as an open circuit, node Z at the drain of transistor P2 is pulled to voltage VDDIO_LEVEL of signal VDDIO at a source of transistor P2. In other words, node Z is at a high voltage value of IO supply voltage VDDIO_LEVEL. Effectively, circuit 700 has level shifted input signal I having a core voltage VDDCORE_LEVEL to output Z having an IO voltage VDDIO_LEVEL. When signal I is logically low, however, transistor N3 is turned off, and transistors N3 and N1 function as an open circuit. At the same time, signal IN is logically high. Operations of circuit 700 on signal IN are similar to operations of circuit 700 on signal I as explained above.

A voltage level of signal POCINT at the gate of NMOS transistor N1 is selected to turn on NMOS transistor N1 when level shifter 700 operates in the normal operational mode. The voltage level of signal POCINT is also selected to protect a gate oxide of NMOS transistor N3. For example, when a voltage VGDN3 (not labeled) dropped across a gate and a drain of transistor N3 is too high, the gate oxide of transistor N3 is damaged. Signal POCINT is selected such that voltage VGDN3 is within an acceptable range.

In some embodiments, a voltage VDSN3 (not labeled) dropped between the drain and the source of transistor N3 is selected to be about 120%-130% of core supply voltage VDDCORE_LEVEL. Voltage VDSN3 is a result of voltage VDDIO_LEVEL of signal VDDIO at the source of transistor P1 being dropped through the source and the drain of PMOS transistor P1 and the drain and the source of NMOS transistor N1. In some embodiments, the voltage drop between the source and the drain of PMOS transistor P1 is 0 V. For illustration, if voltage POCINT is at 1.5 V, and a voltage drop between the source and the drain of transistor N1 is 0.3 V, VDSN3 is 1.5 V−0.3 V or 1.2 V, which is acceptable in some embodiments in which core supply voltage VDD-CORE_LEVEL is about 0.9 V. But if voltage POCINT is about 1.8 V, voltage VDSN3 is 1.8 V−0.3 V−1.5 V, which is too high and would damage a gate oxide of transistor N3.

Signal POC at a gate of an NMOS transistor N5 is used to control NMOS transistor N5. In some embodiments, toward the end of a power-on mode, such as between time t2 and time t3 in FIG. 1, signal POC is logically high. Transistor N5 is therefore turned on. When the power on mode ends and a normal operation of circuit 700 starts, signal POC is logically low, and transistor N5 is therefore turned off.

Signal POC, signal POCINT, and NMOS transistor N5 reduce or eliminate a crow bar current in circuit 700. For example, initially, at time t0 in FIG. 1, voltage VDDIO is 0 V. Voltage POC follows voltage VDDIO and is also 0 V. As a result, inputs I and IN are 0 V. Voltage POCINT is also 0 V. NMOS transistors N1 and N2 are therefore turned off until time t3 when voltage POC is logically low that turns off NMOS transistor N20 in FIGS. 3-6, and voltage POCINT is sufficiently high to turn on transistors N1 and N2. Voltage VDDIO and thus voltage POC start to increase until voltage POC passes a threshold voltage of NMOS transistor N5. Transistor N5 is therefore turned on, and pulls output Z to a low logic level or ground at a source of transistor N5. Output Z is also electrically connected to a gate of PMOS transistor P1. As a result, transistor P1 is turned on, and output ZN follows voltage VDDIO at the source of transistor P1. Voltage VDDCORE remains at a low logical value. Inputs I and IN in the core domain are still logically low. As a result, no current or an insignificant amount of current flows from output Z or output ZN to ground. In other words, a crow bar current is reduced or eliminated.

Compared with other approaches, various embodiments of the present disclosure are advantageous. For example, in those approaches, when outputs of the voltage level shifter circuit are in an unknown state, a crowbar current is generated.

Exemplary Methods

Figure 8:
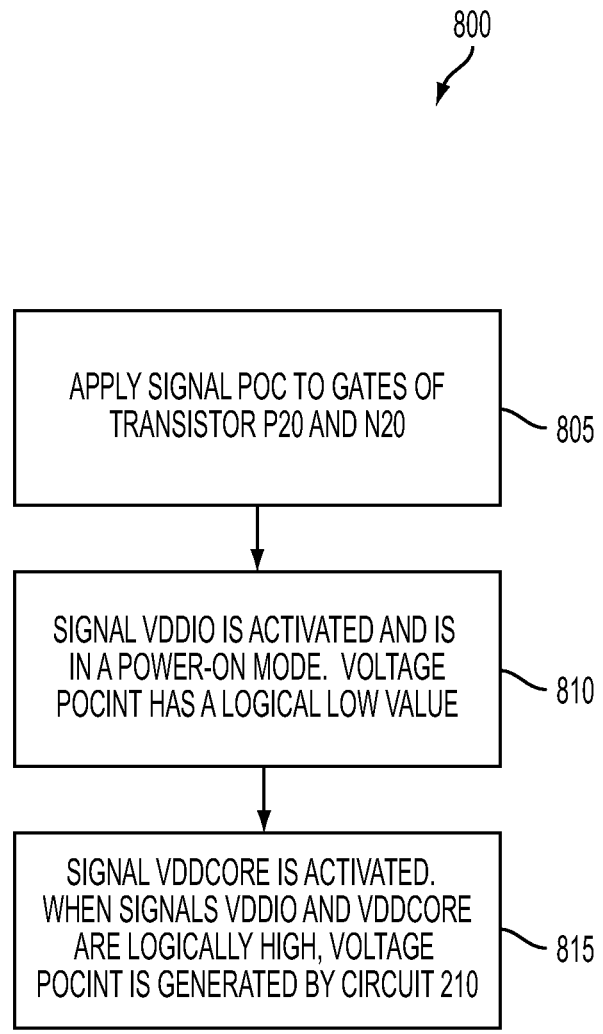
FIG. 8 is a flowchart of a method of operating the voltage generating circuit in FIG. 2, in accordance with some embodiments.

FIG. 8 is a flowchart 800 of a method of operating voltage generating circuit 200 in FIG. 2, in accordance with some embodiments. Effectively, flowchart 800 is also a method of generating voltage POCINT. For illustration, initially, signals VDDIO and VDDCORE are deactivated and are at 0 V.

In operation 805, signal POC is applied to gates of transistors P20 and N20 in FIG. 2.

In operation 810, signal VDDIO is activated to result in a power-on mode of signal VDDIO. Signal POC substantially follows signal VDDIO and causes voltage POCINT to have a low logical value.

In operation 815, signal VDDCORE is activated. When both signals VDDIO and VDDCORE reach a point to be considered logically high, such as at time t3 in FIG. 1, signal POC turns to be logically low. As a result, NMOS transistor N20 in FIG. 2 is turned off and PMOS transistor P20 is turned on. Voltage POCINT is generated by sub voltage generating circuit 210 based on voltage VDDIO_LEVEL of signal VDDIO at the source of transistor P20.

Figure 9:
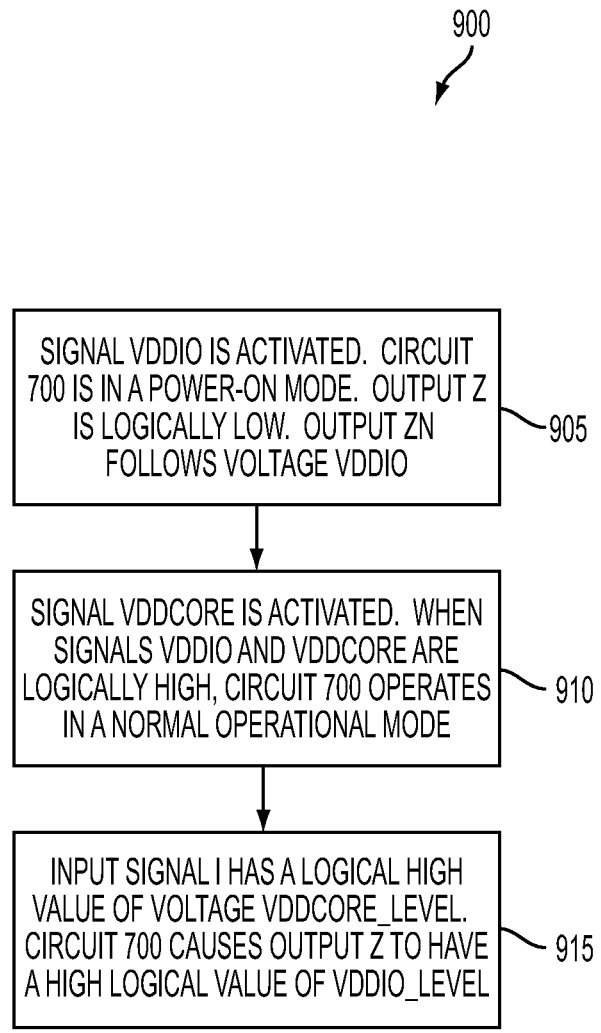
FIG. 9 is a flowchart of a method of operating the voltage level shifting circuit in FIG. 7, in accordance with some embodiments.

FIG. 9 is a flowchart 900 of a method of operating voltage level shifter 700, in accordance with some embodiments. For illustration, one of circuits 300, 400, 500, or 600 is selected to be used as sub voltage generating circuit 210 in circuit 200 in FIG. 2. In other words, signal POCINT is generated by one of circuits 300, 400, 500, or 600 for use by circuit 700. Further, both voltages VDDIO and VDDCORE are at 0 V so that circuit 700 is turned off.

In operation 905, voltage VDDIO is activated at time t0 in FIG. 1. For example, a voltage value of 1.8 V is generated for voltage VDDIO_LEVEL in FIG. 1. Circuit 700 therefore starts a power-on mode in between time t0 and time t3. Voltage VDDIO and voltage POC start to increase. Between time t0 and before voltage POC passes a threshold voltage of NMOS transistor N5, outputs Z and ZN are logically low because signal POCINT is low that turns off transistors N1 and N2. When voltage POC passes a threshold voltage of NMOS transistor N5, NMOS transistor N5 is turned on, and pulls output node Z to a known state of a ground reference level at the source of transistor N5. PMOS P1 transistor is turned on, and outputs ZN follows voltage VDDIO at the source of transistor P1. The known state of outputs Z and ZN resulting in circuit 700 generating an insignificant amount or zero amount of a crowbar current.

In operation 910, signal VDDCORE is activated at time t0', and voltage VDDCORE starts to increase. Circuit 700 enters a normal operation mode when circuit 700 ends the power on condition at time t3. In other words, circuit 700 enters the normal operation mode when voltage VDDIO reaches 1.8 V and voltage VDDCORE reaches about 0.6 V. During the normal operation mode, signal POC is logically low, and transistor N5 is turned off to be electrically disconnected from circuit 700. Further, circuit 200 in FIG. 2 generates voltage POCINT sufficiently high to turn on NMOS transistor N1 but sufficiently low to not damage core NMOS transistor N3.

In operation 915, input signal I is applied with a high logical value of voltage VDDCORE_LEVEL. As a result, transistor N3 is turned on, which, together with transistor N1, pulls node ZN to a low logical value at the source of transistor N1. Consequently, PMOS transistor P2 is turned on, which pulls output Z to voltage VDDIO_LEVEL of signal VDDIO at the source of transistor P2. Effectively, circuit 700 has shifted voltage VDDCORE_LEVEL of input I to voltage VDDIO_LEVEL of output Z.

In the above illustrations, input I is logically high. When input I is logically low, input IN is logically high. Based on the symmetrical characteristics of circuit 700, operations of circuit 700 when input IN is logically high are similar to operations of circuit 700 when input I is logically high, taking account of the symmetrical characteristics of circuit 700.

In some embodiments, a voltage generating circuit includes a first supply voltage node, a first switching device, a sub voltage generating circuit, and a second switching device. The first supply voltage node is configured to have a first supply voltage value, and is coupled with the first switching device. The sub voltage generating circuit is coupled in between the first switching device and the second switching device. The first switching device and the second switching device are configured to receive a control signal behaving based on the first supply voltage value and a second supply voltage value different from the first supply voltage value.

In some embodiments regarding a method for generating a first voltage, during a power on mode of a second voltage and a third voltage, the first voltage is caused to have a first voltage value based on a control signal that behaves based on a value of the second voltage and a value of the third voltage. During an operational condition of the second voltage and the third voltage, the first voltage is caused to have a second voltage value based on the value of the second voltage.

In some embodiments, a voltage level shifting circuit comprises a first PMOS transistor a second PMOS transistor, a first NMOS transistor, a second NMOS transistor, a third NMOS transistor, a fourth NMOS transistor, and a voltage generating circuit. A source of the first PMOS transistor and a source of the second PMOS transistor are coupled together and are configured to receive a first supply voltage value. A gate of the first PMOS transistor is coupled with a drain of the second PMOS transistor and a drain of the second NMOS transistor, and is configured as a first output of the voltage level shifting circuit. A gate of the second PMOS transistor is coupled with a drain of the first PMOS transistor and a drain of the first NMOS transistor, and is configured as a second output of the voltage level shifting circuit. A source of the first NMOS transistor is coupled with a drain of the third NMOS transistor. A gate of the third NMOS transistor is configured as a first input of the voltage level shifting circuit. A source of the second NMOS transistor is coupled with a drain of the fourth NMOS transistor. A gate of the fourth NMOS transistor is configured as a second input of the voltage level shifting circuit. The voltage generating circuit is configured to generate a voltage for use at gates of the first NMOS transistor and the second NMOS transistor based on the first supply voltage value and on a signal behaving based on the first supply voltage value and a second supply voltage value different from the first supply voltage value.

In some embodiments relate to a method of operating a voltage level shifting circuit, during a power on mode of the voltage level shifting circuit, a stabilization circuit coupled with an output of the voltage level shifting circuit is used to place the output of the voltage level shifting circuit in a predetermined state. The voltage level shifting circuit ends the power on mode and functions in an operation mode when each of a first supply voltage node and a second supply voltage node reaches a respective voltage value and the stabilization circuit is off. A first high logical value is provided to a first input of the voltage level shifting circuit. Based on the first high logical value, the voltage level shifting circuit generates a second high logical value different from the first high logical value. An output transistor of the voltage level shifting circuit is of a first supply voltage domain. An input transistor of the voltage level shifting circuit is of a second supply voltage domain different from the first supply voltage domain. A switching device coupled with the output of the voltage level shifting circuit is controlled by a first signal generated based on a second signal that behaves based on a voltage value of the first supply voltage node and a voltage value of the second supply voltage node.

A number of embodiments have been described. It will nevertheless be understood that various modifications may be made without departing from the spirit and scope of the disclosure. For example, various transistors being shown having a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular level when a signal is activated and/or deactivated. Selecting different levels is within the scope of various embodiments. A ground reference is shown in different circuits. A different reference voltage value is within the scope of various embodiments. In various embodiments, a transistor functions as a switch. A switching circuit used in place of a transistor is within the scope of various embodiments. Various figures showing discrete resistors are for illustration. Equivalent circuitry may be used. For example, a resistive device, circuitry or network (e.g., a combination of resistors, resistive devices, circuitry, etc.) can be used in place of the resistor.

The above examples include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a first power domain signal of a first power domain, the first power domain signal having a first supply voltage which can vary between a reference value and a first desired value greater than the reference value;
a second power domain signal having a second supply voltage which can vary between the reference value and a second desired value, the second desired value being between the first desired value and the reference value; and
a voltage generating circuit comprising:
a first supply voltage node;
a reference node;
a first switching device comprising a first transistor sized to operate in the first power domain, the first transistor having a first gate;
a sub voltage generating circuit; and
a second switching device comprising a second transistor sized to operate in the first power domain, the second transistor having a second gate,
wherein
the first supply voltage node is configured to have a voltage level between the reference value and the first supply voltage value, and is coupled with the first switching device;
the reference node is configured to have a voltage level of the reference value, and is coupled with the second switching device;
the sub voltage generating circuit is coupled in between the first switching device and the second switching device; and
the first switching device and the second switching device are configured to receive a control signal which can vary between the reference value and the first desired value,
wherein, during a power-on mode,
the control signal follows activation of the first power domain signal, and
the voltage generating circuit is configured to have the first desired value at each of the first gate, the second gate, and the first supply voltage node when the control signal has the first desired value.

2. The circuit of claim 1, wherein
the first transistor is a PMOS transistor;
the second transistor is an NMOS transistor;
a source of the PMOS transistor is configured to serve as the first supply voltage node;
a drain of the PMOS transistor is coupled with the sub voltage generating circuit;
a drain of the NMOS transistor is coupled with the sub voltage generating circuit, and is configured to provide a voltage at an output of the voltage generating circuit;

a source of the NMOS transistor is coupled with the reference node; and the first gate and the second gate are coupled together and are configured to receive the control signal.

3. The circuit of claim 1, wherein
the sub voltage generating circuit is configured to generate a shift voltage at an output of the voltage generating circuit when the first switching device is on and the second switching device is off, the shift voltage has a voltage level between the first desired value and the reference value.

4. The circuit of claim 1, wherein
the sub voltage generating circuit is configured to generate a shift voltage at an output of the voltage generating circuit when the control signal has the reference value to turn on the first switching device and to turn off the second switching device.

5. The circuit of claim 1, wherein
the sub voltage generating circuit includes a first resistive device and a second resistive device;
a first end of the first resistive device is coupled with the first switching device; and
a second end of the first resistive device is coupled with a first end of the second resistive device and with the second switching device.

6. The circuit of claim 1, wherein
the sub voltage generating circuit includes at least one diode;
the at least one diode is coupled in series when the at least one diode includes more than one diode;
a first end of the at least one diode is coupled with the first switching device; and
a second end of the at least one diode is coupled with the second switching device.

7. The circuit of claim 1, wherein
the sub voltage generating circuit includes at least one transistor configured as a diode;
the at least one transistor configured as a diode is coupled in series when the at least one transistor includes more than one transistor configured as a diode;
a first end of the at least one transistor configured as a diode is coupled with the first switching device; and
a second end of the at least one transistor configured as a diode is coupled with the second switching device.

8. A method of generating a shift voltage by a voltage generating circuit of a circuit, the method comprising:
providing a first power domain signal having a first supply voltage which can vary between a reference value and a first desired value greater than a first threshold value, the first threshold value being greater than the reference value;
providing a second power domain signal having a second supply voltage which can vary between the reference value and a second desired value greater than a second threshold value, the second threshold value being between the first threshold value and the reference value;
providing a control signal which can vary between the reference value and the first desired value, the control signal rising from the reference value to the first desired value substantially concurrently with the first power domain signal;
during a power-on mode, when each of the control signal and the first supply voltage of the first power domain signal has risen from the reference value to a voltage level greater than the first threshold value and when the second supply voltage of the second power domain signal has a value less than the second threshold voltage, causing the shift voltage to have a first voltage value based on the reference value, wherein the causing the shift voltage to have the first voltage value comprises:
receiving the control signal with a first transistor; and
using the first transistor having a gate terminal at the voltage level of the first supply voltage of the first power domain signal and a source terminal at the voltage level of the first supply voltage of the first power domain signal; and
after the power-on mode, when the first supply voltage of the first power domain signal has a voltage level greater than the first threshold value and when the second supply voltage of the second power domain signal has a value greater than the second threshold voltage, causing the shift voltage to have a second voltage value based on a value of the first supply voltage of the first power domain signal.

9. The method of claim 8, wherein
the causing the shift voltage to have the second voltage value comprises causing a voltage drop of the control signal from a value greater than the first threshold value down to the reference value.

10. The method of claim 9, wherein
the causing the voltage drop of the shift voltage value comprises using a voltage divider with an end having a voltage derived from the second supply voltage.

11. The method of claim 9, wherein
the causing the voltage drop of the shift voltage value comprises using at least one diode with an end having a voltage derived from the second supply voltage.

12. The method of claim 9, wherein
the causing the voltage drop of the shift voltage value comprises using at least one second transistor configured as a diode with an end having a voltage derived from the second supply voltage.

13. A circuit, comprising:
a first supply voltage node configured to have a first supply voltage value which can vary between a reference value and a first desired value greater than the reference value;
a second supply voltage node configured to have a voltage level of a reference value;
a third supply voltage node configured to have a second supply voltage value which can vary between the reference value and a second desired value, the first desired value being greater than the second desired value;
a first power domain signal of a first power domain, the first power domain signal having a supply voltage of the first supply voltage value;
a second power domain signal of a second power domain, the second power domain signal having a supply voltage of the second supply voltage value;
a first P-type transistor sized to operate in the first power domain, the first P-type transistor comprising a drain terminal, a source terminal, and a gate terminal, the source terminal of the first P-type transistor coupled with the first supply voltage node;
a first N-type transistor sized to operate in the first power domain, the first N-type transistor comprising a drain terminal, a source terminal, and a gate terminal, the source terminal of the first N-type transistor coupled with the second supply voltage node, and the gate terminal of the first P-type transistor and the gate terminal of the first N-type transistor being coupled together; and a sub circuit coupled between the drain terminal of the first P-type transistor and the drain terminal of the first N-type transistor, the sub circuit being configured to generate a predetermined voltage drop between the drain terminal of the first P-type transistor and the drain terminal of the first N-type transistor, wherein the gate terminal of the first P-type transistor and the gate terminal of the first N-type transistor are configured to receive a control signal which can vary between the reference value and the first desired value, the control signal rising from the reference value to the first desired value substantially concurrently with the first supply voltage value of the first power domain signal during a power-on mode, and the circuit is configured to have the first desired value on the first supply voltage node when the control signal has the first desired value.

14. The circuit of claim 13, wherein the sub circuit comprises:

a first resistive device coupled between the drain terminal of the first P-type transistor and the drain terminal of the first N-type transistor; and second resistive device coupled between the drain terminal of the first N-type transistor and the second supply voltage node.

15. The circuit of claim 13, wherein the sub circuit comprises at least one diode coupled between the drain terminal of the first P-type transistor and the drain terminal of the first N-type transistor.

16. The circuit of claim 15, wherein the at least one diode includes a second P-type transistor having a diode-connected configuration.

17. The circuit of claim 15, wherein the at least one diode includes a second N-type transistor having a diode-connected configuration.

18. A method of generating an output signal by a voltage generating circuit of a circuit, comprising:

receiving a control signal at gate terminals of a first P-type transistor and a first N-type transistor, the first P-type transistor comprising a source terminal coupled with a first supply voltage, the first N-type transistor comprising a source terminal coupled with a reference node, and a sub circuit coupled between a drain terminal of the first P-type transistor and a drain terminal of the first N-type transistor, the control signal substantially following a voltage level of the first supply voltage during a power-on mode when a voltage level of a second supply voltage is less than a threshold value, and the control signal having a voltage level at the reference node when the voltage level of the second supply voltage node is greater than the threshold value after the power-on mode; and generating the output signal at the drain terminal of the first N-type transistor, the output signal being set at a voltage level equal to or less than the voltage level of the first supply voltage minus a predetermined voltage drop generated by the sub circuit when the first P-type transistor is turned on responsive to the control signal, wherein the circuit comprises:

a first power domain signal having the first supply voltage as a supply voltage and having a first supply voltage value; and a second power domain signal having the second supply voltage as a supply voltage and having a second supply voltage value, the first supply voltage value being greater than the second supply voltage value, and when the first P-type transistor is turned off responsive to the control signal, the generating the output signal comprises the voltage generating circuit having the first supply voltage at each of the gate terminal of the first P-type transistor and the source terminal of the first P-type transistor.

19. The method of claim 18, further comprising:

generating the voltage drop by the voltage generating circuit, the voltage generating circuit comprising a diode, a diode-connected transistor, or a voltage divider including at least two resistive devices.

20. The circuit of claim 1, wherein the second supply voltage rises from the reference value to the second desired value a delay-time after the first supply voltage and the control signal have risen from the reference value to the first desired value.

21. The method of claim 8, further wherein the second supply voltage rises from the reference value to the second desired value a delay-time after the first supply voltage and the control signal have risen from the reference value to the first desired value.

22. The circuit of claim 13, wherein the second supply voltage rises from the reference value to the second desired value a delay-time after the first supply voltage and the control signal have risen from the reference value to the first desired value.

\* \* \* \* \*